(12) United States Patent
Arnold

(10) Patent No.: US 9,595,249 B2
(45) Date of Patent: *Mar. 14, 2017

(54) ELECTRONIC SIGNAL PROCESSOR

(71) Applicant: Jeffrey Arnold, Danville, IL (US)

(72) Inventor: Jeffrey Arnold, Danville, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/974,749

(22) Filed: Dec. 18, 2015

(65) Prior Publication Data

US 2016/0111073 A1    Apr. 21, 2016

Related U.S. Application Data

(63) Continuation of application No. 14/301,004, filed on Jun. 10, 2014, now Pat. No. 9,251,775, which is a continuation of application No. 13/331,914, filed on Dec. 20, 2011, now Pat. No. 8,779,274, which is a continuation of application No. 12/126,460, filed on May 23, 2008, now Pat. No. 8,084,679, which is a (Continued)

(51) Int. Cl.

| | |
|---|---|
| *G10H 1/08* | (2006.01) |
| *G10H 3/18* | (2006.01) |
| *H03F 3/68* | (2006.01) |
| *H03G 5/02* | (2006.01) |
| *H03G 7/00* | (2006.01) |
| *G10H 1/12* | (2006.01) |
| *H03F 3/181* | (2006.01) |

(52) U.S. Cl.
CPC ............... *G10H 3/187* (2013.01); *G10H 1/12* (2013.01); *H03F 3/181* (2013.01); *H03F 3/68* (2013.01); *H03G 5/025* (2013.01); *H03G 7/001* (2013.01); *G10H 2210/311* (2013.01); *G10H 2220/265* (2013.01); *H03F 2200/03* (2013.01)

(58) Field of Classification Search
CPC ...... G10H 3/187; G10H 1/12; G10H 2210/31; G10H 2220/265; H03F 3/181; H03F 2200/03; H03G 5/025; H03G 7/001; G03F 3/68

See application file for complete search history.

(56) References Cited

U.S. PATENT DOCUMENTS

| | | |
|---|---|---|
| 2,142,580 A | 1/1939 | Williams |
| 2,600,046 A | 6/1952 | Bobb |

(Continued)

OTHER PUBLICATIONS

Ampeg VL-502/1002 amp schematic, 3 pages, Feb. 20, 1991.

(Continued)

*Primary Examiner* — Tuan D Nguyen
(74) *Attorney, Agent, or Firm* — Barich IP Law Group

(57) ABSTRACT

An electronic signal processor for processing signals includes a complex first filter, one or more gain stages and a second filter. The first filter is characterized by a frequency response curve that includes multiple corner frequencies, with some corner frequencies being user selectable. The first filter also has at least two user-preset gain levels which may be alternately selected by a switch. Lower frequency signals are processed by the first filter with at least 12 db/octave slope, and preferably with 18 db/octave slope to minimize intermodulation distortion products by subsequent amplification in the gain stages. A second filter provides further filtering and amplitude control. The signal processor is particularly suited for processing audio frequency signals.

24 Claims, 6 Drawing Sheets

Related U.S. Application Data continuation of application No. 10/623,433, filed on Jul. 18, 2003, now Pat. No. 7,390,960.

(56) References Cited

U.S. PATENT DOCUMENTS

| | | | |
|---|---|---|---|
| 3,319,176 A | | 5/1967 | Guisinger |
| 3,375,460 A | | 3/1968 | Miller |
| 3,404,348 A | | 10/1968 | Hansen et al. |
| 3,418,418 A | | 12/1968 | Wilder |
| 3,440,557 A | | 4/1969 | Sundeen |
| 3,524,143 A | | 8/1970 | Munch, Jr. |
| 3,530,224 A | | 9/1970 | Plunkett et al. |
| 3,548,323 A | | 12/1970 | Gordon et al. |
| 3,553,566 A | | 1/1971 | Nagy |
| 3,577,090 A | | 5/1971 | Montgomery, Jr. |
| 3,633,043 A | | 1/1972 | Anthony |
| 3,742,114 A | | 6/1973 | Barkan |
| 4,031,319 A | | 6/1977 | Desai |
| 4,119,922 A | | 10/1978 | Schroder |
| 4,320,534 A | | 3/1982 | Sakai et al. |
| 4,322,995 A | * | 4/1982 | Tavel ............... G10H 1/057 327/553 |
| 4,479,250 A | | 10/1984 | Flood |
| 4,581,587 A | | 4/1986 | Powell |
| 4,584,700 A | | 4/1986 | Scholz |
| 4,701,957 A | | 10/1987 | Smith |
| 4,890,331 A | * | 12/1989 | Brown, Sr. ......... H03F 1/327 381/120 |
| 4,995,084 A | | 2/1991 | Pritchard |
| 5,023,915 A | | 6/1991 | Brown et al. |
| 5,032,796 A | | 7/1991 | Tiers et al. |
| 5,124,668 A | | 6/1992 | Christian |
| 5,127,059 A | | 6/1992 | Elion et al. |
| 5,131,044 A | | 7/1992 | Brown, Sr. et al. |
| 5,201,009 A | | 4/1993 | Yamada et al. |
| 5,509,080 A | | 4/1996 | Roberts |
| 5,530,924 A | | 6/1996 | Miller |
| 5,537,079 A | | 7/1996 | Gosser et al. |
| 5,560,924 A | | 10/1996 | Wunderlich et al. |
| 5,574,792 A | | 11/1996 | Konno |
| 5,619,578 A | | 4/1997 | Sondermeyer et al. |
| 5,649,015 A | | 7/1997 | Paddock et al. |
| 6,034,316 A | | 3/2000 | Hoover |
| 6,140,870 A | * | 10/2000 | Cook ............... H03F 3/28 330/118 |
| 6,222,110 B1 | | 4/2001 | Curtis et al. |
| 6,621,907 B1 | | 9/2003 | Smith |
| 6,631,195 B1 | | 10/2003 | Pritchard |
| 6,792,120 B1 | | 9/2004 | Szenics |
| 7,390,960 B1 | | 6/2008 | Arnold |
| 7,683,710 B2 | | 3/2010 | Arnold |
| 7,855,598 B2 | | 12/2010 | Arnold |
| 7,932,458 B2 | | 4/2011 | Arnold |
| 8,084,679 B2 | | 12/2011 | Arnold |
| 8,779,274 B2 | | 7/2014 | Arnold |
| 9,251,775 B2 | | 2/2016 | Arnold |

OTHER PUBLICATIONS

Matchless DC30 amp schematic, 2 pages, Dec. 21, 2001.
Magnatone M-13 amp schematic, 2 pages, Published 1991.
Marshall model 2001 bass amp schematic, 1 page, Apr. 16, 1981.
Orange 'Graphic MKII' amp schematic, 1 page, 1972.
Sansamp GT-2 schematic, 1 page, 2002.
Ampeg SVT bass amp schematic, 2 pages, 1972.
Ampeg SVPCL bass amp schematic, 1 page, Apr. 19, 1999.
Ampeg SVT 4 Pro bass amp schematic, 1 page, Sep. 26, 1996.
Crate BV150H Three Channel Guitar Amplifier, 4 pages, May 24, 2001.
Wiring Diagram for the Ampeg VL-1002 amp, 1 page, Sep. 19, 1991.

* cited by examiner

ELECTRONIC SIGNAL PROCESSOR

RELATED APPLICATIONS

This application is a continuation of application Ser. No. 14/301,004 filed Jun. 10, 2014 entitled "Electronic Signal Processor" which is a continuation of application Ser. No. 13/331,914 filed Dec. 20, 2011 now U.S. Pat. No. 8,779,274 entitled "Electronic Signal Processor" which is a continuation of application Ser. No. 12/126,460 filed May 23, 2008 now U.S. Pat. No. 8,084,679 entitled "Electronic Signal Processor" which is a continuation of application Ser. No. 10/623,433 filed Jul. 18, 2003, entitled "Electronic Signal Processor", now U.S. Pat. No. 7,390,960, all of which are hereby incorporated by reference in their entirety.

FIELD OF THE INVENTION

The present invention relates generally to electronic signal processors. More particularly, a preferred embodiment of the invention relates to altering or controlling the tonal qualities of electronic signals, such as audio signals, and related methods.

BACKGROUND OF THE INVENTION

Various prior art devices exist for modifying the tonal qualities of electronic signals. In audio frequency applications, the types of signals processed can be speech, musical instruments, synthesized waveforms, and the like. Prior art devices for processing musical instrument signals generally have a very limited ability to provide the musician with a variety of tonal qualities in the resulting sound. For example, prior art circuits exist for processing electric guitar signals that have a singular tonal quality, or "sound". This is a serious limitation, since the guitarist must frequently employ a plurality of different circuits if different "sounds" are desired.

Some schemes exist in the art that include circuits with more than a singular sound. Usually this involves adding additional active circuits that the guitarist can activate, as desired. While such an arrangement can be successful, it also results in much greater total component count and added expense.

In addition, in some applications, it is desirable to deliberately add distortion to the sound to affect the tonal qualities. For example, deliberately adding distortion to the sound of an electric guitar began in the 1950's when rock music was becoming popular. At this time, the only techniques that an electric guitarist has to increase the amount of distortion into his sound was to increase the volume of a vacuum tube amplifier by (1) picking the strings of the guitar harder, (2) turning the volume of the guitar higher, or (3) turning the volume of the amplifier up; or some combination or variation of all three techniques. However, these techniques have the drawbacks that the guitarist usually could still not achieve the desired level of distortion, and/or high sound pressure levels were created that many people find uncomfortable or even distressing.

During the 1960's, the characteristic sound of an overdriven vacuum tube amplifier was realized while playing at lower volumes by using new types of circuits. These new circuits were frequently called "fuzzboxes" and were separate boxes that were external to the amplifier. Fuzzboxes typically employed a cascade or series connection of two or more transistor amplifier gain stages that had high input-to-output gain and that were easily overdriven by the output signal from the guitar. This provided a favorable increase in distortion and sustain to the guitar sound. However, it also introduced a new quality to the sound that is disliked by many guitarists. This quality is often referred to as the "solid-state sound" or the "transistor sound". Either of these terms has acquired a very negative connotation to many guitarists. That is, the solid-state or transistor sound is quite different than the "tube sound", which was developed by the overdriven vacuum tube amplifiers.

Many guitarists continue to believe that the best distortion sounds come from amplifiers that employ tube circuits. While the best solid-state amplifiers come close, they are frequently considered to be inferior to the tube amplifiers. Despite the many solid-state amplifiers that have been developed and introduced to the marketplace since the 1960's, the solid-state sound is still not on par with that of the tube amplifiers. Indeed, many different schools of thought exist on why there are differences in the sound and feel between the solid-state and tube amplifiers. Recent attempts to emulate the sound and feel of tube amplifiers have stagnated.

It has been an objective in the guitar industry for many years to develop solid-state amplifiers that have the sound and feel of the overdriven tube amplifier. "Feel" indicates that a tube amplifier also has a certain tactile quality when overdriven. Many guitarists think that the tube amplifiers respond to the guitarists "touch", including their picking techniques and playing style, better than the solid-state amplifiers. In this respect, it is frequently stated that tube amplifiers are very touch sensitive.

There has been a long-felt need for a solid-state amplifier or signal processor that emulates the sound and feel of an overdriven vacuum tube amplifier.

A need also exists for a signal processor that emulates the sound of an overdriven vacuum tube amplifier in which the tone may be adjusted or customized to the user's desires.

Accordingly, it is a general object of the present invention to provide a new and improved signal processor that emulates the sound and feel of an overdriven vacuum tube amplifier.

Another object of the present invention is to provide a signal processor of the solid-state type that emulates the desired performance characteristics of a tube amplifier.

Yet another object of the present invention is to provide a signal processor with sound characteristics that may be adjusted to the user's tastes.

A further object of the present invention is to filter the lower frequency input signals with a second order or third order high pass filter before amplification of the input signals to reduce lower frequency intermodulation distortion when the amplifier is overdriven.

A still further object of the present invention is to provide at least two individual gain controls with overlapping gain characteristics that may be switched to provide selectable gain of those frequencies in the passband of the input filter.

Another object of the present invention is to provide related methods of filtering an input signal with an input filter of the second or third order high pass type to substantially reduce lower frequency intermodulation distortion in the signal processor.

BRIEF SUMMARY OF THE INVENTION

This invention is directed to an electronic signal processor that has improved ability to alter the tonal characteristics of an audio frequency input signal and to reduce lower frequency intermodulation distortion. The signal processor may have a buffer stage to receive the input signal and to provide an input signal with low output impedance to the first filter of the signal processor.

A first filter is preferably a second or third order high pass filter with a frequency response curve of 12 db/octave slope or 18 db/octave slope for the lower frequencies, respectively. One of the purposes of the first filter is to substantially reduce lower frequency intermodulation distortion by means of such filtering. The first filter also has at least some user-selectable corner frequencies in its frequency response curve so that the user may customize the tonal quality of the signal processor. The first filter preferably also includes at least two adjustable gain levels with overlapping gain characteristics that may be pre-set by the user and that may be alternately selected. The multiple, user-preset, selectable gain levels allow the user to adjust the amount of distortion present in, and therefore the tonal color of, the processor output.

The output of the first filter is input to one or more limiting gain stages, which are in series or cascade configuration. These gain stages can increase the amount of distortion present in the processor output. Oppositely poled diodes in the feedback circuits of the amplifiers in the gain stages limit the output amplitude of the amplifiers and contribute to the distortion characteristics of the signal processor. Preferably, the gain stages have an additional or second feedback circuit that introduces a controlled amount of hysteresis, a nonlinear distortion, in the amplification characteristic of the gain stages. Thus, when the gain stages are overdriven by the input signal, the clipping or distortion in the output signal of the gain stages will be enhanced.

The present invention also relates to amplifiers with two feedback loops for use in the gain stages of signal processors. The first feedback loop includes a resistor, a capacitor and at least two diodes, with the diodes oppositely poled between the output of the amplifier and its inverting input. The second feedback circuit includes at least one resistor and at least one capacitor coupled between the output of the amplifier and the input of the gain stage. A resistor preferably couples the second feedback loop to the inverting input of the amplifier. The two feedback loops interact to enhance the distortion when the amplifier is overdriven by an input signal.

The output from the gain stages is input to a second filter, which is of the low pass type and preferably of the second order low pass type. The output the second filter is provided as the output of the signal processor.

Related methods of processing an input signal that includes a band of frequencies to reduce lower frequency intermodulation distortion includes filtering the input signal with the first filter of the second or third order type, supplying the filtered signal to the gain stages, amplifying the filtered signal in the gain stages, supplying the amplified signal to a second filter of the low pass type, filtering the amplified signal in the second filter, and supplying the signal from the second filter as the output signal of the signal processor. The methods also include changing at least some of the corner frequencies in the frequency response curve of the first filter to change or customize the frequency response of the first filter. The methods further include selecting one of the two gain controls in the first filter.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures in which like reference numerals identify like elements, and in which:

DETAILED DESCRIPTION OF THE INVENTION

Figure 1:
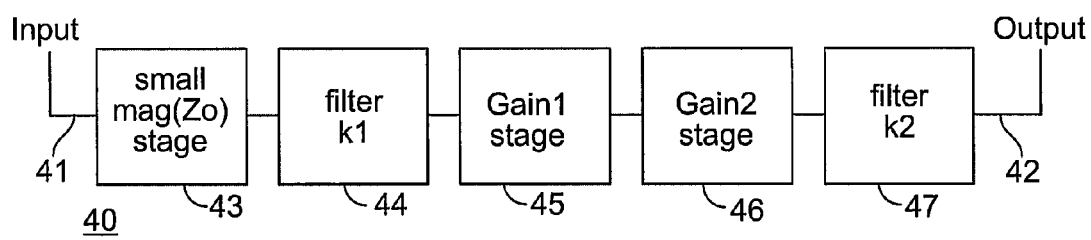
FIG. 1 is a block diagram of the signal processor of the present invention.

The present invention of a signal processing circuit, generally designated 40, is shown in block diagram format in FIG. 1. An input signal is received at an input terminal 41 to a small magnitude output impedance stage 43. Stage 43 preferably has an output impedance that is significantly smaller than the input impedance of a first filter k1 44 so as not to materially affect the corner frequencies of the first filter 44. First filter 44 is a complex filter with multiple user-adjustable corner frequencies and passband gains. The output of filter 44 is input into a first gain stage 45. The output of the first gain stage 45 is input into a second gain stage 46. The output of the second gain stage 46 is input into a second filter k2 47, which provides the output signal of the signal processing circuit 40 at a terminal 42.

Figure 2:
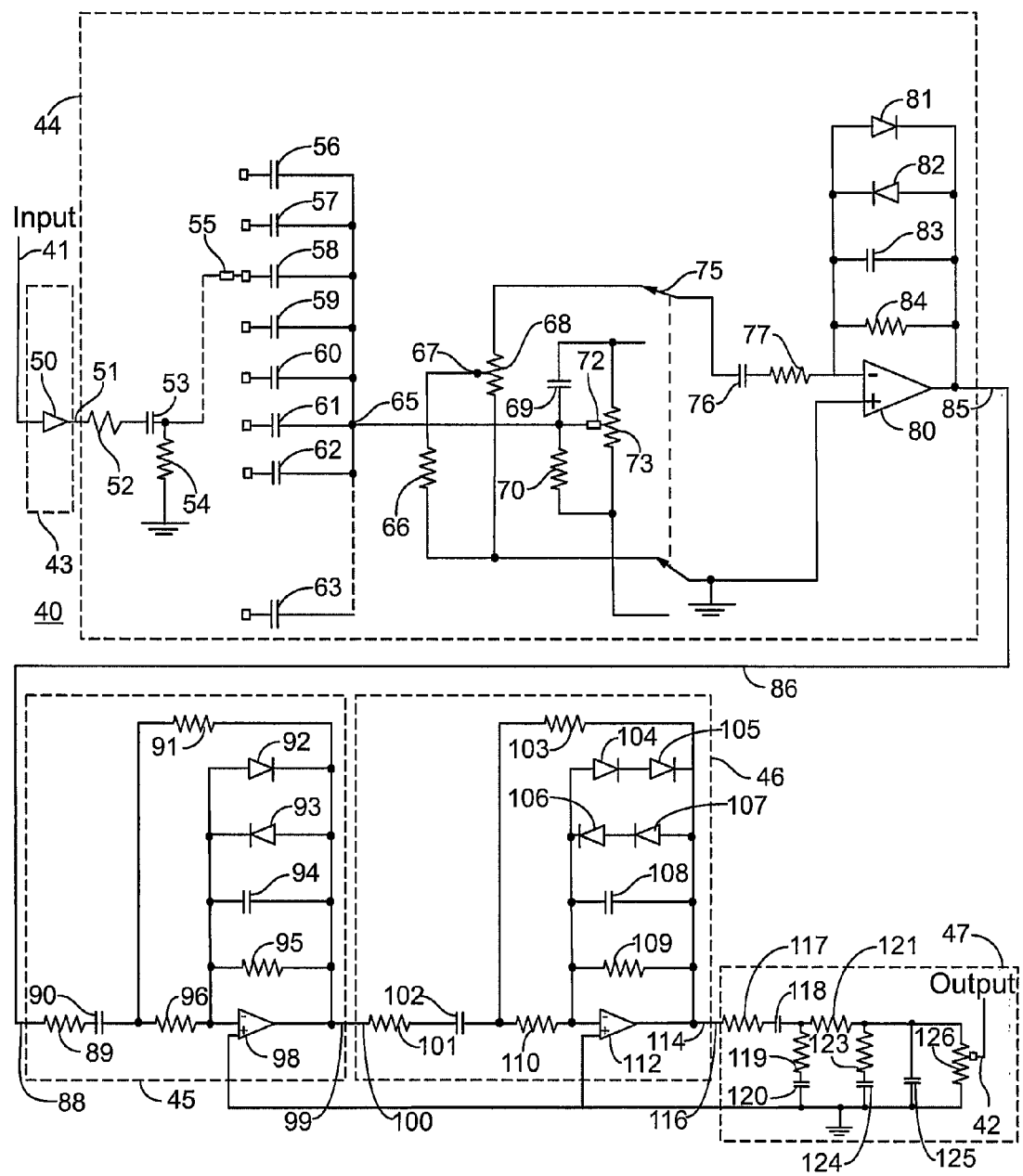
FIG. 2 is a schematic circuit diagram of a preferred embodiment of the signal processor of the present invention.

A preferred schematic for the signal processor circuit 40 is shown in FIG. 2 with the blocks identified in FIG. 1 shown in dashed lines about certain components of the schematic diagram. The design and operation of circuit 40 will now be further considered in its various portions corresponding to the blocks 43-47 shown in FIGS. 1-2.

In general an input signal, such as from a guitar, is buffered by the low output impedance stage 43 before presentation to the first filter 44. For example, as shown in FIG. 2, the low output impedance stage 43 may consist of an amplifier 50 that is configured for unity gain. While not shown in block 43 of FIG. 2, it may also be desirable to provide low pass filtering at the input terminal 41. For example, frequencies above the audio band, such as radio frequency interference (RFI) or the like, may be attenuated at or near the input to amplifier 50.

Figure 3:
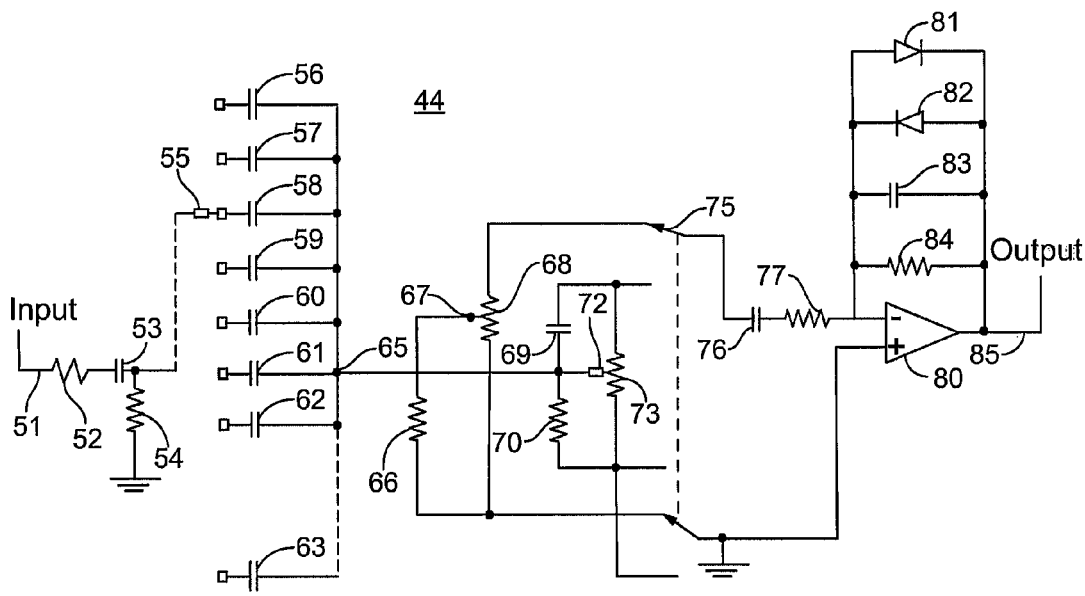
FIG. 3 is a schematic circuit diagram of a preferred embodiment of an input filter for the signal processor shown in FIGS. 1 and 2.

First filter 44 shown in FIG. 3 provides filtering of the low frequencies in the audio frequency range to prevent the generation of significant amounts of low frequency intermodulation (IMD) signals, which may result from the subsequent amplification by the first and second gain stages 45 and 46. First filter 44 receives its input signal from the output of the low impedance stage 43 at an input terminal 51. A resistor 52 and a capacitor 53, connected in series, receive signals present on input terminal 51. An opposite terminal of capacitor 53 is referenced to ground by a resistor 54.

A single pole, multiple throw switch 55, which may be a rotary switch with n positions, is connected to capacitor 53 and resistor 54. Switch 55 selects one of n capacitors, such as capacitors 56-63 in the example shown in FIG. 5. Opposite ends of capacitors 56-63 are connected to a common node 65.

A double pole, double throw switch 75 selects one of two networks that are also connected to node 65. In the position shown in FIG. 3, switch 75 selects the first network that includes a pair of resistors 66 and 68. Resistor 68 may be in the form of an adjustable resistor or potentiometer with an adjustable terminal 67 to control the amplitude of the signals provided through filter 44. If switch 75 is in the opposite position from that shown in FIG. 3, the second network consisting of resistor 70, capacitor 69 and variable resistor or potentiometer 73 is selected. This second network also provides control of the amplitude of the signals provided through filter 44 by varying the position of the adjustable terminal 72 of variable resistor 73. In addition, capacitor 69 provides some additional filter effects over that of the first network consisting of resistors 66 and 68.

Whichever network is selected by switch 75 provides the signals though the series connection of a capacitor 76 and a resistor 77 to the inverting input of an operational amplifier 80. Op amp 80 has its non-inverting terminal referenced to ground. Op amp 80 also has a pair of diodes 81 and 82 oppositely poled between the output terminal and the inverting terminal of op amp 80 to keep op amp 80 from being overdriven. A resistor 84 and a capacitor 83 are also connected as feedback components, in parallel with diodes 81-82, between the output terminal and inverting terminal of op amp 80. Op amp 80 also provides the output signal of first filter 44 at an output terminal 85.

First filter 44 provides different rates of signal gain or attenuation over different frequency ranges. In the illustrated embodiment of first filter 44, there are four corner frequencies f1, f2, f3 and f4, where each corner frequency is defined by the known equation $f=1/(2\pi RC)$ and where R is the effective resistance at the frequency of interest, C is the effective capacitance at the frequency of interest and $\pi$ is the well-known value of 3.1415 . . . .

FIGS. 4 through 7 illustrate the different effects that are provided by the first filter 44. While FIGS. 4-7, 10 and 12 do not have a scale along the frequency axis, it will be understood that these frequency response charts generally cover the frequency range of about 0 Hz to 20 KHz, which includes the audio frequency range, which is often specified as 20 Hz to 20 KHz. As will be presented more fully below, the frequency response of the first filter 44 depends upon which of capacitors 56-63 is selected by switch 55, the first or second network selected by switch 75, and the position or adjustment selected for potentiometers 68 or 73. Irrespective of these selections, the gain versus frequency graphs shown in FIGS. 4-7 will, in general, have a slope of 18 db/octave in a first frequency band from 0 Hz to f1, 12 db/octave in a second frequency band from f1 to f2, 6 db/octave in a third frequency band from f2 to f3, 0 db/octave in a fourth frequency band (which may also be referred to as a passband) from f3 to f4, and −6 db/octave for frequencies above f4.

Figure 6:
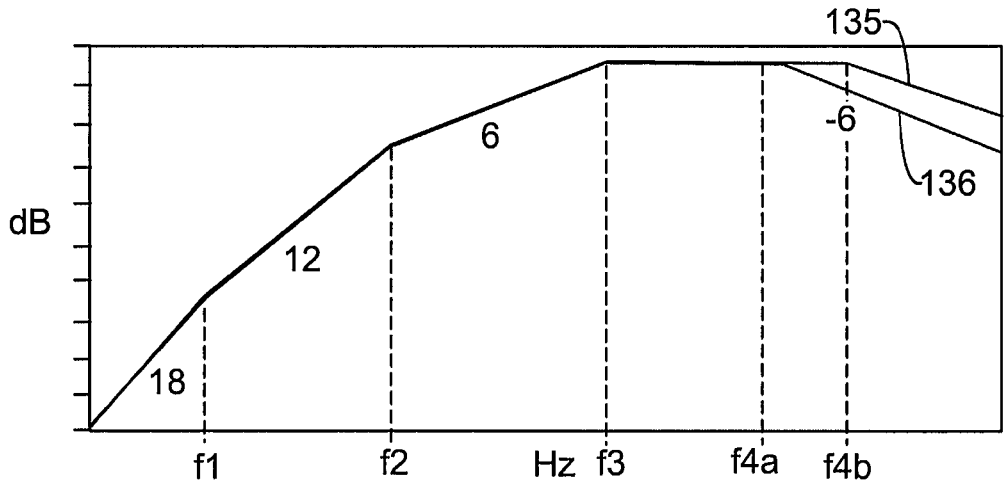
FIG. 6 is a frequency response curve of the input filter shown in the schematic circuit diagram of FIG. 3 under selected circuit conditions.

Filters, such as the first filter 44 that exhibits a slope of 18 db/octave in the lower frequency ranges and a passband of 0 db/octave in the higher frequency ranges are also known in the art as third order high pass filters. In the example of FIG. 6, there is additionally a high frequency rolloff of −6 db/octave above the corner frequency f4. Thus, a filter with the frequency response curve shown in FIG. 4 could also be referred to as a third order high pass filter with high frequency rolloff.

Figure 4:
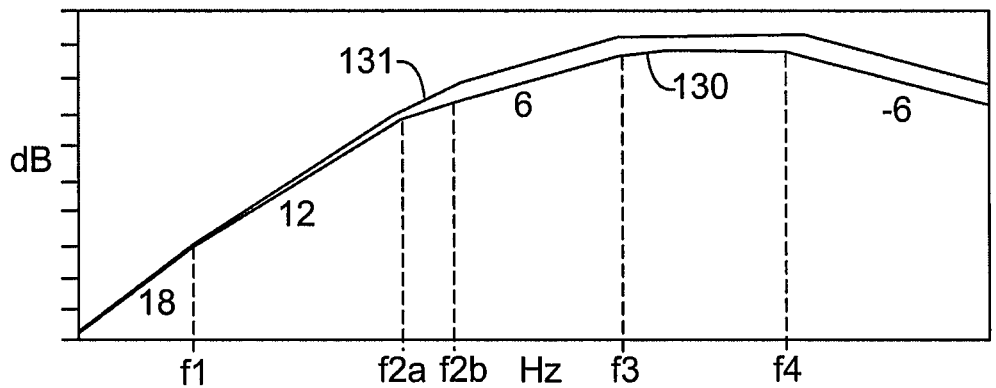
FIG. 4 is a frequency response curve of the input filter of the block diagram shown in the schematic circuit diagram of FIG. 3 under selected circuit conditions.

FIG. 4 illustrates the effects of varying the passband gain with potentiometers 68 or 73, depending upon which of the networks is selected by switch 75. In frequency response graph 130, the gain is set higher than in the graph 131. Of course, if potentiometer 68 is set at for a higher gain value than potentiometer 73, the user may switch from higher to lower gain (and, hence, from higher to lower volume) by changing switch 75 from the position shown in FIG. 3 to the opposite position, and vice versa. To this end, switch 75 may be a foot-operated switch. As illustrated in FIG. 4, the changes in gain tend to have greater affect on those frequency bands that are less attenuated, such as those frequencies that lie between f2 to beyond f4. If either of potentiometers 68, 73 are adjusted by moving the adjustable terminal 67 or 72 to its lower most position, the signal will be completely attenuated since lower pole of switch 75 is referenced to ground. Thus, potentiometers 68, 73 provide a broad range of signal attenuation.

Figure 5:
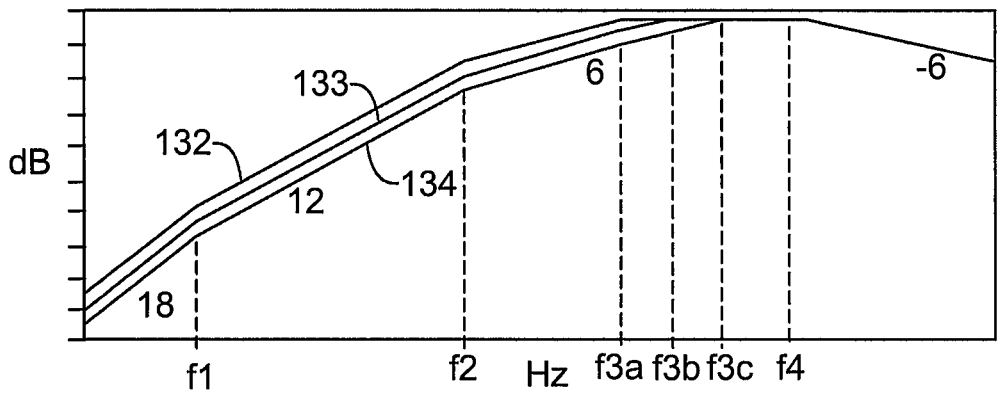
FIG. 5 is a frequency response curve of the input filter shown in the schematic circuit diagram of FIG. 3 under selected circuit conditions.

FIG. 5 illustrates the ability to change the gain characteristics of those portions of the frequency response curve below frequency f3, including the frequency of the corner frequency f3. This is accomplished by changing the position of switch 55 to select one of capacitors 56-63. Capacitors 56-63 are selected to be of different capacitive values to provide different frequency response characteristics. FIG. 5 shows three different frequency response graphs 132-134 for three different capacitive values. Of course, with n capacitors of different capacitive value, n different frequency response curves will result instead of the three shown in FIG. 5. Note also that changing the capacitive value with switch 55 will also affect the corner frequency f3. In the example shown, corner frequency f3a is associated with frequency response curve 132, corner frequency f3b is associated with frequency response curve 133 and corner frequency f3c is associated with frequency response curve 134. In general, a lower capacitive value for one of the capacitors 56-63 will cause the corner frequencies f1, f2 and f3 to shift toward higher frequencies. For example, in order to provide a range of effects through the selection of one of the n capacitors with switch 55 for audio signal applications, the capacitor with the lowest value preferably moves the 12 db/octave slope up to about 4 to 5 KHz. On the other hand, the capacitor with the highest capacitive value selected by switch 55 preferably moves the 12 db/octave slope down to about 30 Hz. Thus, the lower frequencies that the 12 db/octave portion of the frequency response curve operates on can range from about 30 Hz to about 5 KHz. The actual selection will depend upon the preferences of the user.

FIG. 6 illustrates the ability to change the gain characteristics of that portion of the frequency response curve above the corner frequency f4. The feedback components, capacitor 83 and resistor 84, across op amp 80 normally determine the frequency of corner frequency f4a when switch 75 is in the position shown in FIG. 3. This results in the frequency response graph shown by graph 136. However, when switch 75 is in the opposite position to that shown in FIG. 3, capacitor 69 will change the frequency response to a graph such as graph 135 in FIG. 6. Note that in graph 135, capacitor 69 also causes an increase in the corner frequency f4b above that of f4a, and an increase in the higher frequency gain above that of graph 136.

Figure 7:
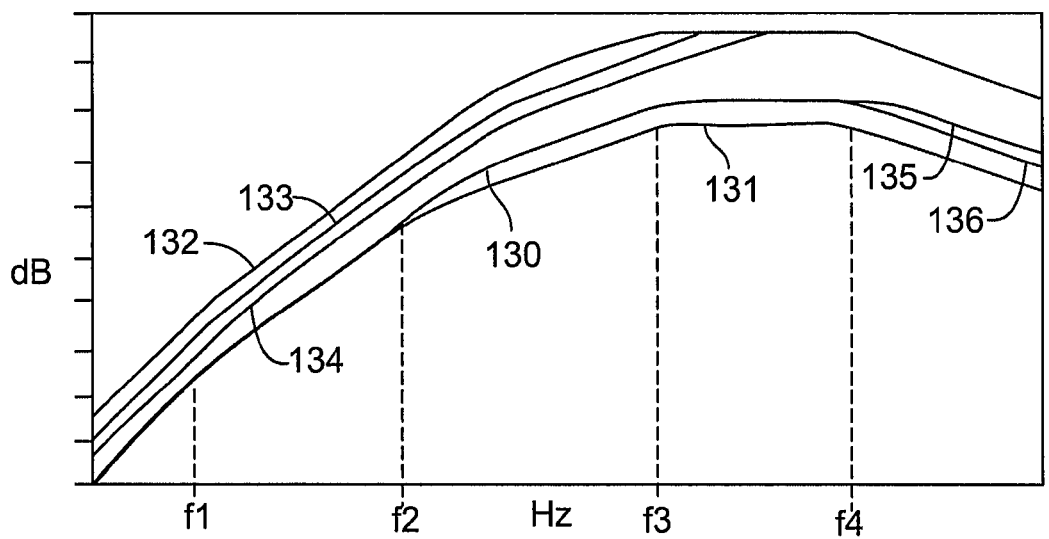
FIG. 7 is a frequency response curve of the input filter shown in the schematic circuit diagram of FIG. 3 under selected circuit conditions.

FIG. 7 is a composite of the frequency response graphs of FIGS. 4-6. The frequency shifts of some of the corner frequencies have not been illustrated, as in FIGS. 4-6, for purposes of simplifying this composite graph. It will thus be appreciated that the above-described differing techniques for customizing the frequency response characteristics of the first filter 44 provide the ability to customize or fine tune any portion of the audio frequency spectrum, as desired by the user.

Figure 8:
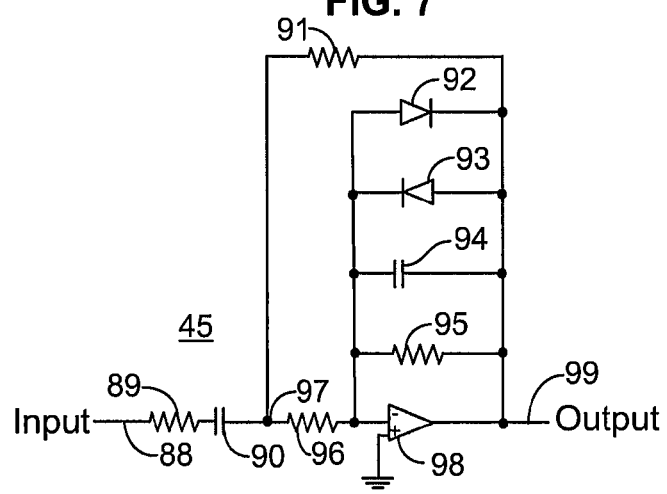
FIG. 8 is a schematic circuit diagram of a preferred embodiment of an amplifier stage for the signal processor shown in FIG. 2.

The preferred embodiment of an amplifier for the first gain stage 45 in FIG. 3 is shown in FIG. 8. An input terminal 88 of the first gain stage 45 passes input signals through a resistor 89 and a capacitor 90 to a node 97. Node 97 is connected via a feedback resistor 91 to the output terminal of an op amp 98 and via a resistor 96 to the inverting input of op amp 98. The non-inverting input of op amp 98 is referenced to ground. Feedback components, including a capacitor 94 and a resistor 95, are connected from the inverting input to the output of op amp 98. Oppositely poled diodes 92 and 93, also connected from the inverting input to the output of op amp 98, keep the op amp output amplitude limited. Diodes 92-93 clip symmetrically and therefore tend to limit the amount of distortion when the op amp 98 is overdriven. Diodes 92-93 also tend to provide some nonlinear distortion such as hysteresis when op amp 98 is overdriven since the feedback capacitor 94 will be charged by conduction of diodes 92-93. However, when diodes 92-93 become non-conductive, the impedance seen by feedback capacitor 94 increases and capacitor 94 takes longer to discharge. Thus, the first feedback circuit consisting of diodes 92-93, capacitor 94 and resistor 95 operates in two different impedance modes, depending upon whether diodes 92-93 are conductive or non-conductive.

The amplifier embodiment of FIG. 8 has superior performance characteristics when used in signal processors for guitars. It is desirable for the best tonal characteristics resulting from clipping caused by gain stage 45, when overdriven, that the clipping not be symmetrical. To this end, a second feedback circuit, consisting of resistors 89 and 91 and capacitor 90, creates additional nonlinear distortion such as hysteresis in the response of the gain stage 45. Resistor 96 provides some interaction between the first feedback circuit consisting of resistor 95, capacitor 94 and diodes 92-93, and the second feedback circuit. This additional nonlinear distortion such as hysteresis provides further distortion of the input signal by gain stage 45 when the op amp 98 is overdriven.

Figure 9:
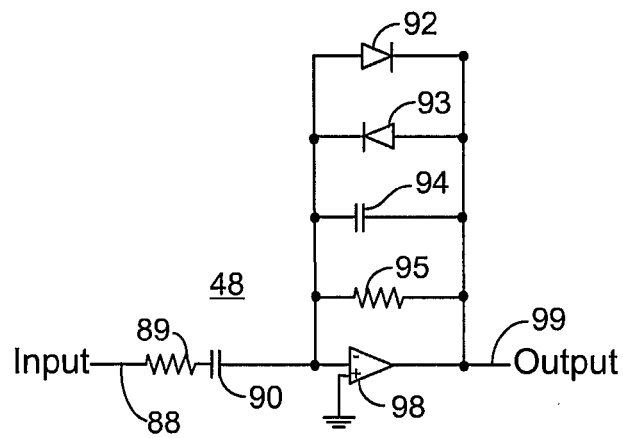
FIG. 9 is a schematic circuit diagram of an alternate embodiment of an amplifier stage for the signal processor shown in FIG. 2.
Figure 10:
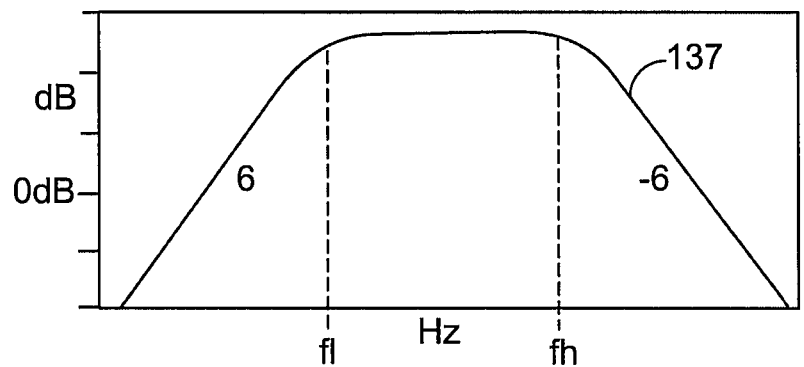
FIG. 10 is a frequency response curve of the amplifier stages shown in the schematic circuit diagrams of FIGS. 8 and 9.

A simplified gain stage, generally designated 48, is shown in FIG. 9, may be used in place of the gain stage 45 of FIG. 8, if desired. Simplified gain stage 48 is similar in structure and operation to gain stage 45, except that resistors 91 and 96 of gain stage 45 that form a portion of an additional feedback loop about op amp 98 in FIG. 8 are eliminated. Thus, the operation of gain stage 48 is similar in operation to the op amp 80 in the first filter 44, as described above.

The gain stages employed in the second gain stage 46 in FIG. 1 are preferably similar to those used in the first gain stage, and as shown in FIG. 8 or FIG. 9. However, the second gain stage may have pairs of diodes 104-105 and 106-107 oppositely poled across the op amp 112 as shown in the complete schematic of FIG. 2 to allow for greater amplitude signals before the diodes 104-107 become operative and limit the output amplitude.

Second gain stage 46 is connected in series or cascade with the first gain stage 45. Each of gain stages 45, 46 preferably has a gain of greater than one and is nominally inverting. The frequency response for gain stages 45 or 46 is shown by a graph 137 in FIG. 10, and has a lower corner frequency fl and a higher corner frequency fh. From 0 Hz to fl, the slope is 6 db/octave. From fl to fh, which is the passband, the slope is 0 db/octave. At frequencies above fh, the slope is −6 db/octave.

Figure 11:
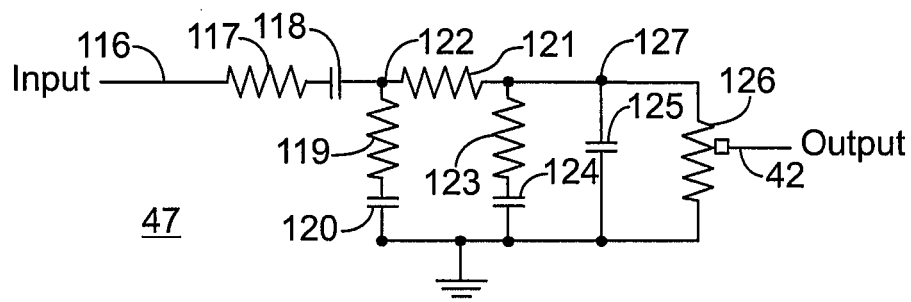
FIG. 11 is a schematic circuit diagram of an output filter for the signal processor shown in FIG. 1.

The second filter stage, generally designated 47, is shown in FIG. 11. An input terminal 116 receives input signals from the output terminal of the second gain stage 46. Input terminal 116 is connected via a resistor 117 and capacitor 118 to a node 122. A resistor 119 and a capacitor 120 are connected in series between node 122 and ground. Node 122 is also connected via a resistor 121 to another node 127. A resistor 123 and a capacitor 124 are connected in series between node 127 and ground. Also separately connected in parallel between node 127 and ground are a capacitor 125 and a potentiometer 126. The variable wiper arm of potentiometer 126 is connected to the output terminal 42 of the signal processor 40 of FIG. 2. Potentiometer 126 may function as the volume control for the signal processor.

Figure 12:
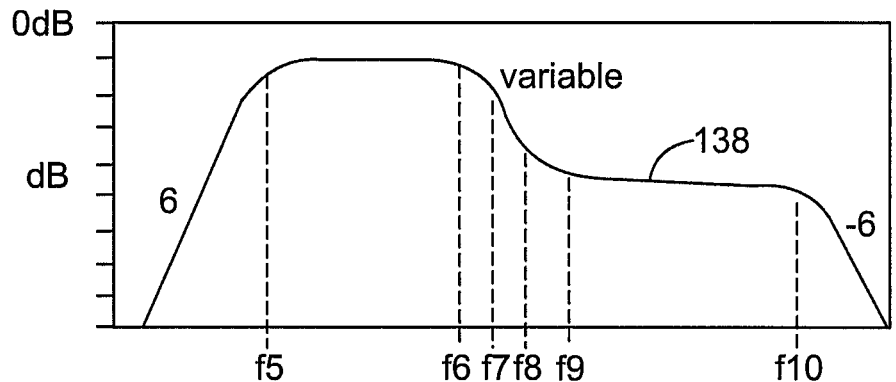
FIG. 12 is a frequency response curve of the output filter shown in the schematic circuit diagram of FIG. 11 under selected circuit conditions.

The second filter 47 may have a complex frequency response as shown by the graph 138 in FIG. 12. Graph 138 may have six positive corner frequencies, f5, f6, f7, f8, f9 and f10, in order of increasing frequency. From 0 Hz to corner frequency f5, the slope is 6 db/octave; from corner frequency f5 to corner frequency f6, the slope is 0 db/octave; from corner frequency f6 to corner frequency f7, the slope is −6 db/octave; from corner frequency f7 to corner frequency f8, the slope is −12 db/octave; from corner frequency f8 to corner frequency f9, the slope is −6 db/octave; from corner frequency f9 to corner frequency f10, the slope is 0 db/octave; and above corner frequency f10, the slope is −6 db/octave. Capacitor 118 creates the low frequency rolloff below corner frequency f5, and capacitor 125 creates the high frequency rolloff above corner frequency f10.

Figure 13:
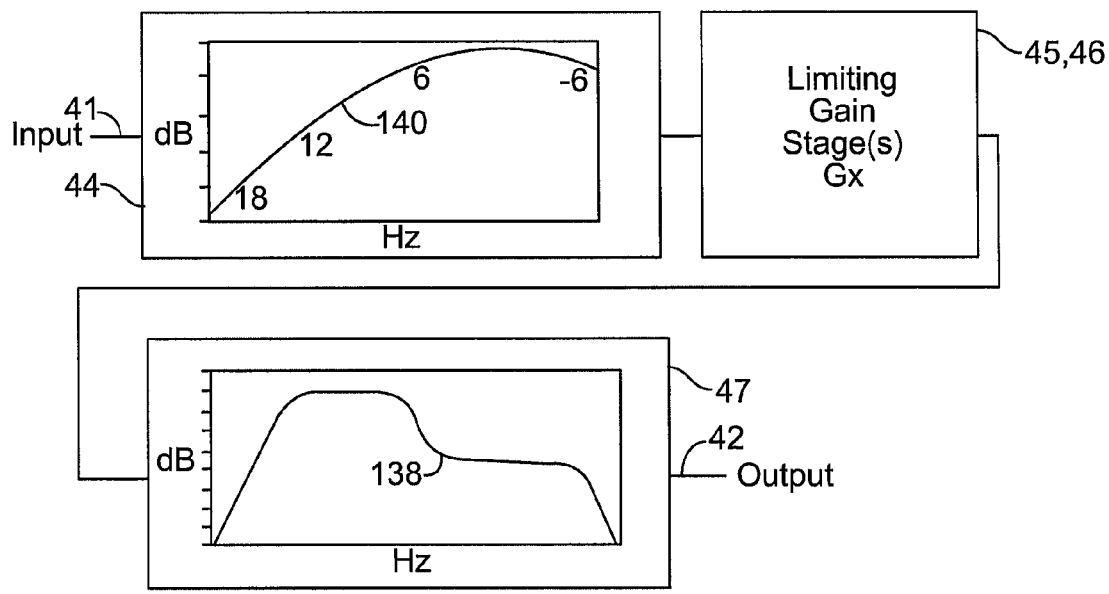
FIG. 13 is a block diagram that is related to the block diagram of FIG. 1, but with the preferred frequency responses of the first and second filters inserted in the respective filter blocks.

FIG. 13 is a block diagram that is related to the block diagram shown in FIG. 4, but with the preferred frequency responses of the first and second filters 44, 47 shown in the filter blocks. In addition, the two gain stages 45-46 are shown combined in FIG. 13 into a single stage. While preferred embodiments of the circuitry for the filters 44, 47 have been presented above in FIGS. 3 and 11, it will be appreciated by those skilled in the art that these filters could be active or passive and provide the desired frequency response curves. In accordance with one aspect of the present invention, at least 12 db/octave is used in the lower frequencies of the audio spectrum to provide greater attenuation of the lower audio frequencies. This helps minimize the production of lower frequency intermodulation distortion (IMD) frequency products, as previously discussed above, by the significant gain of the gain stages 45-46. This avoids the commonly known muddy sound produced by prior art amplifiers.

The gain stages 45-46 may be combined into a single gain, or constitute a plurality of individual gain stages coupled together in the known cascade configuration.

The distortion produced may be modified by providing some offset voltage to the operational amplifiers, such as by referencing the non-inverting inputs to op amps 98 and 112 in FIGS. 2 and 8-9 to a reference (bias) voltage instead of to ground. Such use of bias voltage may be necessary if the op amps have unequal positive and negative supply voltages. These op amps 98 and 112 operate linearly so long as they are not overdriven. As previously discussed, if the op amps 98 and 112 are overdriven, the feedback diodes 92-93 and 104-107 will be rendered conductive. Thus, in the preferred embodiment of the invention, non-linearity of the gain stages results when these normally nonconductive diodes become conductive. These non-linearities may be modified, if desired, by offset biasing of the op amps 98 and 112, such as by biasing the non-inverting inputs at a nonzero reference voltage.

Figure 14:
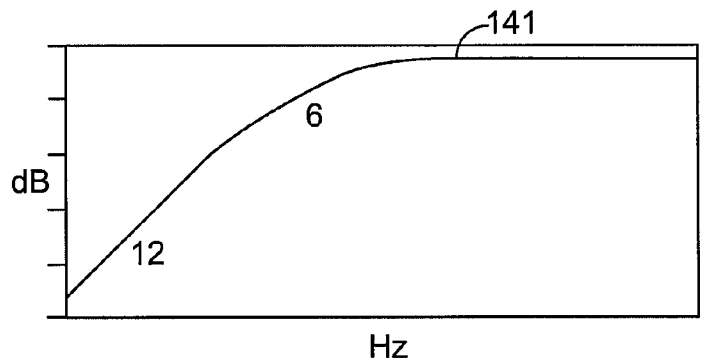
FIG. 14 is an alternate embodiment of the frequency response curve for the first filter k1 shown in the block diagram of FIG. 1.

An alternative frequency response curve 141 is shown in FIG. 14 for the first filter 44, instead of the frequency responses shown in FIGS. 4-7. In this embodiment, frequency response curve 141 has a slope of 12 db/octave at the lowest frequencies instead of 18 db/octave below the corner frequency f1 in FIGS. 4-7. Curve 141 also does not have the high frequency rolloff of −6 db/octave for the higher frequencies, such as above the corner frequency f4 in FIGS. 4-7. Characteristics of curve 141 can be provided by eliminating capacitors 53 and 83 in the schematic of filter 44 in FIG. 3. For example, short circuiting of capacitor 53 will eliminate the additional 6 db/octave of slope at the lowest frequencies of interest, thereby also eliminating the corner frequency f1. Elimination of capacitor 83 will also eliminate the corner frequency f4 in FIGS. 4-7 and the −6 db/octave rolloff for frequencies above f4. However, since capacitor 83 also contributes to the stability of op amp 80, it may be desirable to simply decrease the capacitive value of capacitor 83 such that the corner frequency f4 is above the frequencies of interest, and which effectively increases the passband of 0 db/octave slope. A first filter 44 with the frequency response characteristics of FIG. 14, instead of with the frequency response characteristics of FIGS. 4-7, will provide sufficient attenuation of the lower frequencies prior to amplification by the gain stages 45-46 to minimize IMD frequency products in many applications.

Figure 15:
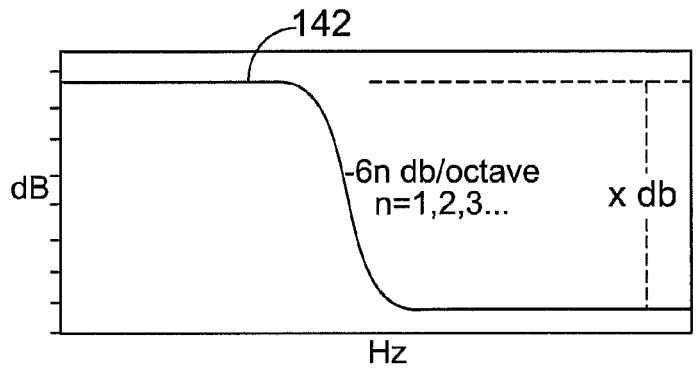
FIG. 15 is an alternate embodiment of the frequency response curve for the second filter k2 shown in the block diagram of FIG. 1.

An alternative frequency response curve 142 is shown in FIG. 15 for the second filter 47, instead of the frequency response curve 138 shown in FIG. 12. In this embodiment, frequency response curve 142 has a slope of 0 db/octave at the lowest frequencies instead of 6 db/octave below the corner frequency f5 in FIG. 12. Curve 142 also does not have the high frequency rolloff of −6 db/octave for the higher frequencies, such as above the corner frequency f10 in FIG. 12. A filter having the frequency response curve shown in FIG. 15 is known as a low pass filter. If the slope above the low frequencies is −12 db/octave for n=2, the filter may be referred to as a second order low pass filter.

The frequency response curve 138 in FIG. 12 may be easily modified to resemble the frequency response curve 142 in FIG. 15 by eliminating the low frequency rolloff capacitor 118 from the schematic shown in FIG. 11 and by eliminating the high frequency rolloff capacitor 125. This will also eliminate the corner frequencies f5 and f10 shown in FIG. 12. Alternately, capacitor 125 may be decreased in value such that the corner frequency f10 is moved to a higher frequency beyond the frequency range shown in FIG. 12.

While particular embodiments of the invention have been shown and described, it will be obvious to those skilled in the art that changes and modifications may be made therein without departing from the invention in its broader aspects.

The invention claimed is:

1. An analog electric filter network system for real-time processing of electrical signals in an electric guitar amplifier, said filter network system including:
   an input port receiving an input analog signal derived in real-time from the output of an electric guitar;
   an output port outputting an output analog signal derived from said input analog signal;
   a first potentiometer, wherein said first potentiometer is adjustable by a user to set at least in part a first voltage gain magnitude value from said input port to said output port at a first frequency;
   a second potentiometer, wherein said second potentiometer is adjustable by a user to set at least in part a second voltage gain magnitude value from said input port to said output port at said first frequency;
   a first network including said first potentiometer;
   a second network including said second potentiometer;
   a rotary switch, wherein said rotary switch is adapted to select at least in part a capacitance value for said analog electric filter network system by selecting at least in part a capacitor having said capacitance value from a plurality of capacitors; and
   a foot-operated switch, wherein said foot-operated switch is adapted to select at least in part an operating network and an operating voltage gain magnitude value for said analog electric filter network system by selecting at least in part either said first network and said first voltage gain magnitude value or said second network and said second voltage gain magnitude value, wherein both said first voltage gain magnitude value and said second voltage gain magnitude value are set at least in part by said capacitance value selected at least in part by said rotary switch,
   wherein said operating network operates in real-time on said input analog signal to derive at least in part said output analog signal.

2. The filter network system of claim 1 further including a first amplifier circuit, wherein said first amplifier circuit is positioned downstream from both said first network and said second network.

3. The filter network system of claim 2 further including a second amplifier circuit, wherein said second amplifier circuit is positioned downstream from said first amplifier circuit.

4. The filter network system of claim 3 wherein both said first network and said second network consist of passive circuit components.

5. The filter network system of claim 1 wherein both of said first potentiometer and said second potentiometer are passive devices and have three terminals.

6. The filter network system of claim 1 wherein both of said first potentiometer and said second potentiometer are passive rotary potentiometers and have three terminals.

7. The filter network system of claim 1 wherein said foot-operated switch contains only a single switch, wherein said single switch has only a single throw.

8. The filter network system of claim 1 wherein both said first network and said second network consist of passive circuit components.

9. An analog electric filter network system for real-time processing of electrical signals in an electric guitar amplifier, said filter network system including:
    an input port receiving an input analog signal derived in real-time from the output of an electric guitar;
    an output port outputting an output analog signal derived from said input analog signal;
    a first potentiometer, wherein said first potentiometer is adjustable by a user to set at least in part a first voltage gain magnitude value from said input port to said output port at a first frequency;
    a second potentiometer, wherein said second potentiometer is adjustable by a user to set at least in part a second voltage gain magnitude value from said input port to said output port at said first frequency;
    a first network including said first potentiometer;
    a second network including said second potentiometer;
    a first capacitor, wherein said first capacitor has a first capacitance value, wherein said first capacitor is included in said first network and excluded from said second network, wherein said first capacitance value sets at least in part said first voltage gain magnitude value;
    a rotary switch, wherein said rotary switch is adapted to select at least in part a second capacitance value for said analog electric filter network system by selecting at least in part a second capacitor having said second capacitance value from a plurality of capacitors; and
    a foot-operated switch, wherein said foot-operated switch is adapted to select at least in part an operating network and an operating voltage gain magnitude value for said analog electric filter network system by selecting at least in part either said first network and said first voltage gain magnitude value or said second network and said second voltage gain magnitude value, wherein both said first voltage gain magnitude value and said second voltage gain magnitude value are set at least in part by said second capacitance value selected at least in part by said rotary switch,
    wherein said operating network operates in real-time on said input analog signal to derive at least in part said output analog signal.

10. The filter network system of claim 9 further including a first amplifier circuit, wherein said first amplifier circuit is positioned downstream from both said first network and said second network.

11. The filter network system of claim 10 further including a second amplifier circuit, wherein said second amplifier circuit is positioned downstream from said first amplifier circuit.

12. The filter network system of claim 11 wherein both said first network and said second network consist of passive circuit components.

13. The filter network system of claim 9 wherein both of said first potentiometer and said second potentiometer are passive devices and have three terminals.

14. The filter network system of claim 9 wherein both of said first potentiometer and said second potentiometer are passive rotary potentiometers and have three terminals.

15. The filter network system of claim 9 wherein said foot-operated switch contains only a single switch, wherein said single switch has only a single throw.

16. The filter network system of claim 9 wherein both said first network and said second network consist of passive circuit components.

17. An analog electric filter network system for real-time processing of electrical signals in an electric guitar amplifier, said filter network system including:
    an input port receiving an input analog signal derived in real-time from the output of an electric guitar;
    an output port outputting an output analog signal derived from said input analog signal;
    a first potentiometer having a first terminal, wherein said first potentiometer is adjustable by a user to set at least in part a first voltage gain magnitude value from said input port to said output port at a first frequency;
    a second potentiometer, wherein said second potentiometer is adjustable by a user to set at least in part a second voltage gain magnitude value from said input port to said output port at said first frequency;
    a first network including said first potentiometer;
    a second network including said second potentiometer;
    a rotary switch, wherein said rotary switch is adapted to select at least in part a capacitance value for said analog electric filter network system by selecting at least in part a capacitor having said capacitance value from a plurality of capacitors;
    a foot-operated switch, wherein said foot-operated switch is adapted to select at least in part an operating network and an operating voltage gain magnitude value for said analog electric filter network system by selecting at least in part either said first network and said first voltage gain magnitude value or said second network and said second voltage gain magnitude value, wherein both said first voltage gain magnitude value and said second voltage gain magnitude value are set at least in part by said capacitance value selected at least in part by said rotary switch; and
    a third potentiometer having a second terminal, wherein said third potentiometer is adjustable by a user to set at least in part both said first voltage gain magnitude value and said second voltage gain magnitude value, wherein said second terminal is positioned downstream from said first terminal,
    wherein said operating network operates in real-time on said input analog signal to derive at least in part said output analog signal.

18. The filter network system of claim 17 further including a first amplifier circuit, wherein said first amplifier circuit is positioned downstream from both said first network and said second network.

19. The filter network system of claim 18 further including a second amplifier circuit, wherein said second amplifier circuit is positioned downstream from said first amplifier circuit.

20. The filter network system of claim 19 wherein both said first network and said second network consist of passive circuit components.

21. The filter network system of claim 17 wherein both of said first potentiometer and said second potentiometer are passive devices and have three terminals.

22. The filter network system of claim 17 wherein both of said first potentiometer and said second potentiometer are passive rotary potentiometers and have three terminals.

23. The filter network system of claim 17 wherein said foot-operated switch contains only a single switch, wherein said single switch has only a single throw.

24. The filter network system of claim 17 wherein both said first network and said second network consist of passive circuit components.

\* \* \* \* \*